(12) United States Patent
Hu

(10) Patent No.: US 10,374,086 B2
(45) Date of Patent: Aug. 6, 2019

(54) 3D TRANSISTOR HAVING A GATE STACK INCLUDING A FERROELECTRIC FILM

(71) Applicant: The Regents of the University of California, Oakland, CA (US)

(72) Inventor: Chenming Hu, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 310 days.

(21) Appl. No.: 15/369,809

(22) Filed: Dec. 5, 2016

(65) Prior Publication Data

US 2017/0162702 A1 Jun. 8, 2017

Related U.S. Application Data

(60) Provisional application No. 62/263,341, filed on Dec. 4, 2015.

(51) Int. Cl.
*H01L 29/78* (2006.01)
*H01L 29/786* (2006.01)
*H01L 29/423* (2006.01)
*H01L 29/51* (2006.01)
*H01L 29/66* (2006.01)
(Continued)

(52) U.S. Cl.
CPC .. *H01L 29/78391* (2014.09); *H01L 29/42392* (2013.01); *H01L 29/516* (2013.01); *H01L 29/6684* (2013.01); *H01L 29/775* (2013.01); *H01L 29/778* (2013.01); *H01L 29/785* (2013.01); *H01L 29/78696* (2013.01)

(58) Field of Classification Search
CPC ........... H01L 29/78391; H01L 29/6684; H01L 29/516; H01L 21/823431; H01L 27/0886; H01L 29/66795; H01L 29/66803; H01L 29/6681; H01L 29/66818; H01L 29/785; H01L 29/7851; H01L 29/7853; H01L 29/7854; H01L 29/7855; H01L 29/7856
See application file for complete search history.

(56) References Cited

U.S. PATENT DOCUMENTS

2008/0001224 A1* 1/2008 Kinoshita ........... H01L 29/6653
257/346
2011/0133164 A1* 6/2011 Bangsaruntip ......... B82Y 10/00
257/24

(Continued)

*Primary Examiner* — Michele Fan
(74) *Attorney, Agent, or Firm* — Gavrilovich, Dodd & Lindsey LLP

(57) ABSTRACT

A three-dimensional (3D) transistor includes a ferroelectric film between the gate and the channel. The 3D transistor can be characterized as a 3D Negative Capacitance (NC) transistor due to the negative capacitance resulting from the ferroelectric film. Performance of the transistor is optimized by manipulating the structure and/or by the selection of materials. In one example, the capacitance of the ferroelectric film ($C_{FE}$) is matched to the sum of the gate capacitance ($C_{MOS}$) and the gate edge capacitance ($C_{EDGE}$), wherein the gate edge capacitance ($C_{EDGE}$) is the capacitance at the edge of the gate and between the gate and the source and its extension, and the gate and the drain and its extension.

29 Claims, 11 Drawing Sheets

(51) Int. Cl.
*H01L 29/775* (2006.01)
*H01L 29/778* (2006.01)

(56) References Cited

U.S. PATENT DOCUMENTS

| | | | |
|---|---|---|---|
| 2013/0105897 A1* | 5/2013 | Bangsaruntip | B82Y 10/00 257/351 |
| 2013/0207079 A1* | 8/2013 | Sleight | H01L 29/775 257/24 |
| 2014/0151761 A1* | 6/2014 | Hsieh | H01L 29/66545 257/288 |
| 2016/0027490 A1* | 1/2016 | Muller | H01L 29/78391 365/145 |
| 2017/0141235 A1* | 5/2017 | Lai | H01L 29/78391 |

* cited by examiner

US 10,374,086 B2

3D TRANSISTOR HAVING A GATE STACK INCLUDING A FERROELECTRIC FILM

RELATED APPLICATIONS

This application claims the benefit of priority of U.S. provisional patent application Ser. No. 62/263,341, filed on Dec. 4, 2015, and incorporated in its entirety herein including all appendices and attachments.

FIELD

This invention generally relates to transistors and more particularly to 3D transistors having a gate stack that includes a ferroelectric film.

BACKGROUND

Two-dimensional (2D) (planar) transistors can be improved by incorporating a ferroelectric film in the gate dielectric stack and the combination is known as a Negative Capacitance Transistor. The improvements include sub-threshold swing that is smaller than 60 mV/decade and the extremely important lower operating voltage. These improvement leads to lower operating power, which is roughly proportional to the voltage squared. However, through years of study, the inventor of the present application discovered that the 2D negative capacitance transistors require costly and unusual substrate structures (nm thin P-on-P+ epitaxial layer or nm thin buried oxide) to achieve satisfactory performance through capacitance matching (between ferroelectric capacitance and MOS capacitance) and suppression of short channel effects. In addition, it is beneficial for many applications to minimize the sub threshold voltage swing of a transistor.

DETAILED DESCRIPTION

Figure 1:
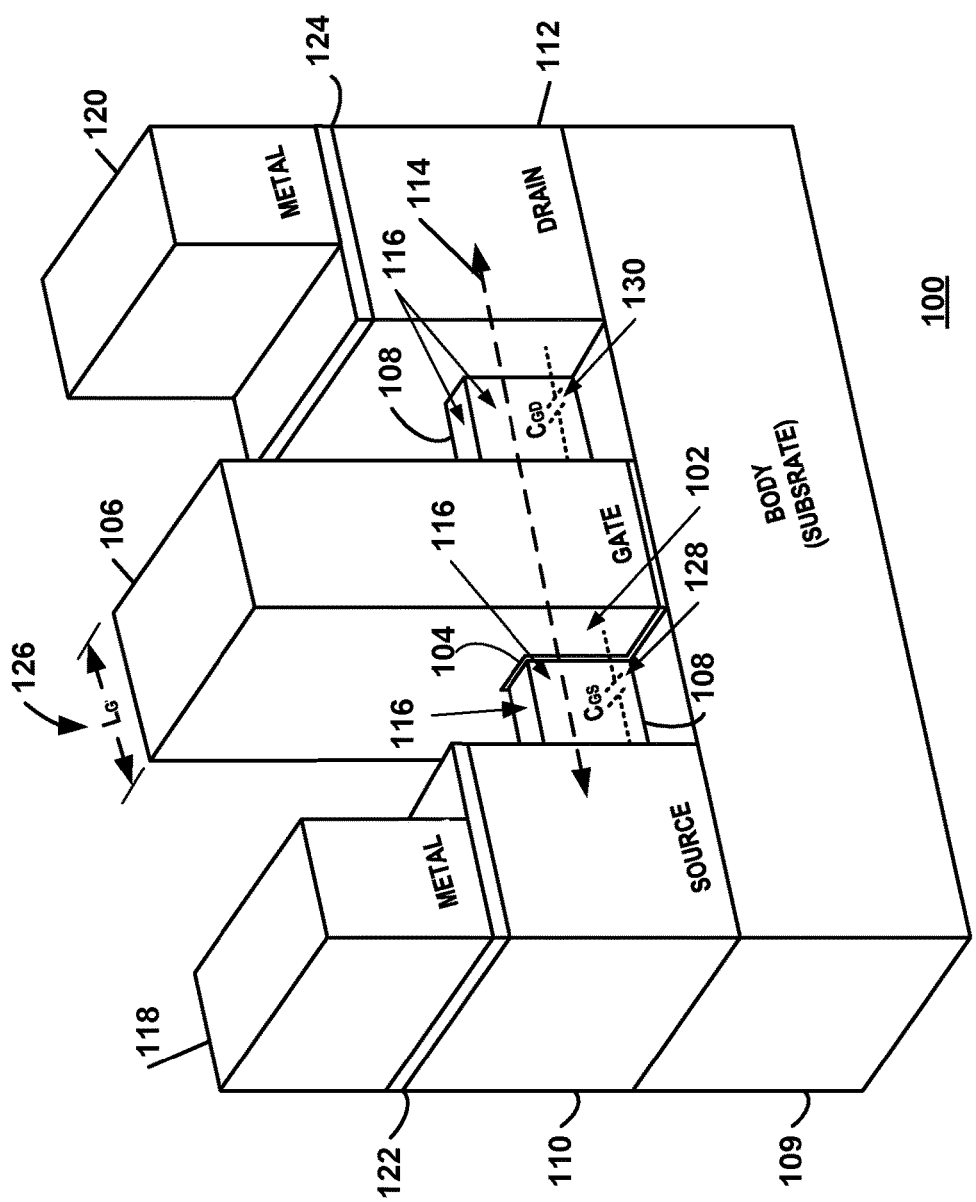
FIG. 1 is a block diagram of a perspective view of an example of a 3D transistor having a gate stack that includes a ferroelectric film between a gate and a channel.

As used herein and in the appended claims, the singular forms "a," "and," and "the" include plural referents unless the context clearly dictates otherwise. Thus, for example, reference to "a gate" includes a plurality of such gates and reference to "the channel" includes reference to one or more channels and so forth.

Also, the use of "or" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of."

Unless defined otherwise, all technical and scientific terms used herein have the same meaning as commonly understood to one of ordinary skill in the art to which this disclosure belongs. Although methods and materials similar or equivalent to those described herein can be used in the practice of the disclosed methods and compositions, the exemplary methods, devices and materials are described herein.

The publications herein are provided solely for their disclosure prior to the filing date of the present application. Nothing herein is to be construed as an admission that the inventors are not entitled to antedate such disclosure by virtue of prior disclosure.

A three-dimensional (3D) transistor includes a ferroelectric film between the gate and the channel. The 3D transistor can be characterized as a 3D Negative Capacitance (NC) transistor due to the negative capacitance resulting from the ferroelectric film. Performance of the transistor is optimized by manipulating the structure and/or by the selection of materials where at least some of the manipulations and selections result in unexpected results based on conventional understandings and techniques. Examples of parameters that are adjusted include the effective oxide thickness (EOT) and parasitic capacitances including gate-to-source, gate-to-drain and gate edge capacitances. Structural dimensions that can be adjusted include the gate length, minimum distance between the gate and the source/drain, the thickness of the ferroelectric material, the height of the source/drain relative to the height of the channel. In one technique, the ferroelectric film capacitance ($C_{FE}$) is matched to but larger than the gate dielectric-to-channel capacitance ($C_{MOS}$) (i.e., $|CFE|>\sim CMOS$) to achieve high gain while $C_{FE}$ is larger than $C_{MOS}$ in order to avoid a current-voltage curve shape that is significantly different from the conventional MOSFET and is undesirable for logic circuit operations. Such a technique however, is limited because $C_{MOS}$ is typically small in the subthreshold region of transmitter operation where a larger $C_{MOS}$ is required for significant voltage gain. As a result, the very small ($C_{MOS}$) in the subthreshold region does not allow for a subthreshold swing less than 59 mV/decade. In another technique discussed herein, however, the $C_{FE}$ is matched to the sum of the gate edge capacitance ($C_{EDGE}$) and $C_{MOS}$ ($|C_{FE}|>~C_{EDGE}+C_{MOS}$). Even when $C_{MOS}$ is small, high gains can be achieved where $C_{EDGE}$ is significantly large. As a result, subthreshold swings less than 59 mV/decade at room temperature are attainable with this technique.

FIG. 1 is a block diagram of a perspective view of an example of a 3D transistor 100 having a gate stack 102 that includes a ferroelectric film 104 between a gate 106 and a channel 108. The 3D transistor with ferroelectric film can be categorized as a negative capacitance (NC) 3D FET due to the negative ferroelectric capacitance. The transistor is implemented on a substrate 109. The transistor 100 for the example is a three-dimensional metal oxide semiconductor field effect (MOSFET) transistor including at least a source 110, a drain 112, a channel 108 positioned between the source 110 and the drain 112, a gate 106 that is positioned adjacent to at least two sides of the channel 108, and a ferroelectric film 104 positioned between the gate 106 and the channel 108. Accordingly, the channel 108 is longitudinally positioned along its longitudinal axis 114 between the source 110 and drain 112 and the gate 106 is next to the two lateral extensions 116 of the source 110 and the drain 112. One example of 3D transistor is a FinFET on silicon-on-insulator (SOI) substrate. The 3D transistor 100, however, may have any one of numerous different structures that include such a general configuration. For example, the 3D transistor may have a FinFET, Trigate, Tri-Gate, Omega-FET, nanowire FinFET, Gate-All-Around, horizontal nanowire, vertical nanowire, or nanotube transistor structure. Therefore, the gate 106 may be positioned over two, three, or four sides of a channel 108 having a rectangular cross section. In some situations, the channel 108 may have more than four sides and, in some cases, may have an infinite number of sides in structures where the cross section is circular, elliptical, or otherwise rounded or curved for at least a portion of the channel 108. A nanotube transistor is an example of such a structure. Other structures may also be used. Some examples of the 3D structures are discussed below with reference to FIG. 4A-K. Although the block diagram example of FIG. 1 resembles the structure of a FinFET, the principles discussed with reference to FIG. 1 can be applied to other 3D transistor structures.

A source metal contact 118 is connected to the source 110 and a drain metal contact 120 is connected to the drain 112. In some situations, thin silicide layer layers 122, 124 separate the metal contacts 118, 120 from the source 110 and drain 112.

For the examples described herein, the transistor 100 includes a ferroelectric film 104 between the gate 106 and the channel 108 for at least a portion of region between the gate 106 and the channel 108. In some situations, the transistor 100 includes a gate dielectric between the ferroelectric film 104 and the channel 108. Other structures may include an internal gate between the ferroelectric film 104 and the gate dielectric. An internal gate is not shown in FIG. 1.

The gate length ($L_G$) 126 is the length of the gate 106 along the longitudinal axis 114 and, therefore, is approximately the length of the gate 108 from the source to the drain. The edges of gate are near, but separated from, the source and drain. As discussed below, the distance between the gate and the source, as well as other factors, determines a parasitic gate to source capacitance ($C_{GS}$) 128. Similarly, the distance between the gate and the drain, as well as other factors, determines a parasitic gate to drain capacitance ($C_{GD}$) 130. The $C_{GS}$ 128 and the $C_{GD}$ 130 increases as the separations between the gate and source and between the gate and drain decrease. The areas of portions of the source and gate that face each other in the source gate edge region also determine $C_{GS}$ 128 and the areas the portions of the drain and gate in the drain gate edge region also determine $C_{GD}$ 130. For the examples described herein, the source and the drain are raised resulting in a higher drain and source areas that increase the parasitic capacitances. As shown in FIG. 1, the source and the drain extend above the channel 108 and are, therefore, "raised". As compared to two dimensional transistors, 3D transistors have increased parasitic gate-to-source and gate-to-drain capacitances as result of the additional source, drain, and gate areas around the channel. Therefore, a raised structure as well as the increased areas due to the 3D structure results in increased parasitic capacitances. Conventional techniques strive to minimize the parasitic gate-to-source and gate-to-drain capacitances $C_{GS}$ 128, $C_{GD}$ 130 in order to improve performance. As discussed in more detail below, however, other increased parasitic capacitances due to the raised source and drain are utilized to improve performance in the 3D transistor examples discussed herein by taking advantage of an unexpected result of introducing a ferroelectric film in the gate structure. As discussed below, an edge capacitance ($C_{EDGE}$) between the gate and the source and drain extensions 116 and between the gate and source/drain through the dielectric and ferroelectric film may contribute to the $C_{EDGE}$. These edge capacitances ($C_{EDGE}$), however, also provide additional capacitance and depend on the minimum distances between the gate and source and between the gate and drain. As discussed below, the $C_{EDGE}$ affects the voltage gain of the transistor and the properties and dimensions of the transistor can be selected to manipulate the edge capacitance ($C_{EDGE}$) and/or the $C_{FE}$ to increase the voltage gain.

Figure 2A:
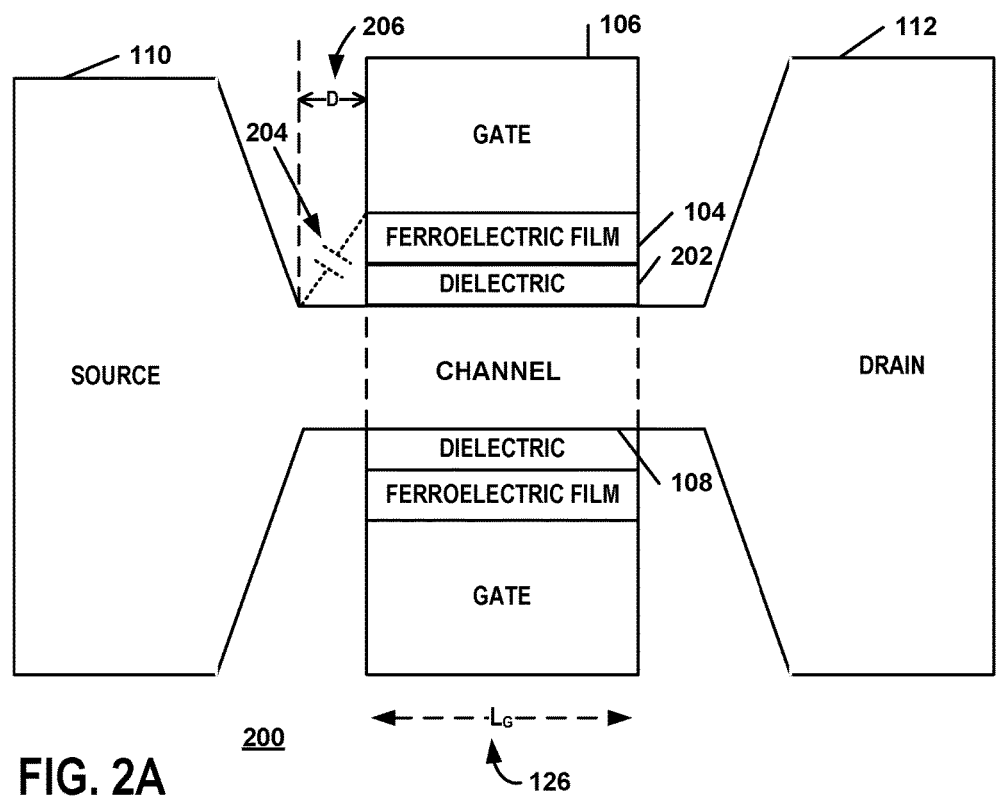
FIG. 2A is a block diagram of a cross sectional top view of the 3D transistor.

FIG. 2A is a block diagram of a cross sectional top view 200, of the 3D transistor 100. Although FIG. 2 is most closely representative of a FinFET, the principles discussed with reference to FIG. 2 and FIG. 3 can be applied to other 3D transistors with ferroelectric layers in the gate stack. The block diagram of FIG. 2 shows the components and regions shown in FIG. 1 as well as showing the dielectric layer 202 between the ferroelectric film and the channel. A gate edge capacitance ($C_{EDGE}$) 204 between the gate and either the source or the drain is determined, at least partially, by the minimum distance (D) 206 from the gate edge to source and to the drain. Decreasing D 206 increases $C_{EDGE}$ 204.

Figure 2B:
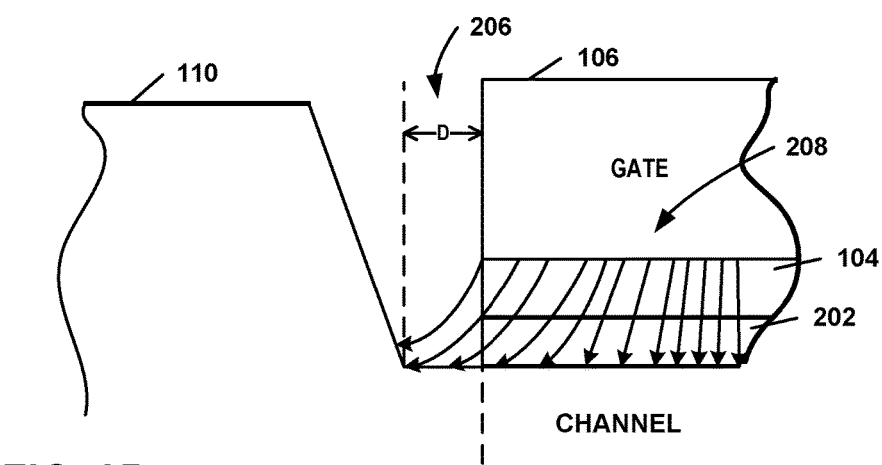
FIG. 2B is a block diagram of a region between the source and gate for the example of FIG. 2A.

FIG. 2B is a block diagram of a region between the source 110 and gate 106 for the example of FIG. 2A. A plurality of electric field lines 208 from the gate to the source extension and source near the edge of the gate represent the edge capacitance, $C_{EDGE}$. As can be seen from FIG. 2B, the electric field lines pass though the ferroelectric film 104. The beneficial effect of $C_{EDGE}$ is to increase the number of the electric field lines that pass through the ferroelectric, which represent the polarization charge of the ferroelectric film. FIG. 2B does not show electric field lines that represent the total $C_{GS}$. The edge capacitance, $C_{EDGE}$ is less than the gate to source capacitance $C_{GS}$ and the gate to drain capacitance $C_{GD}$.

Figure 3:
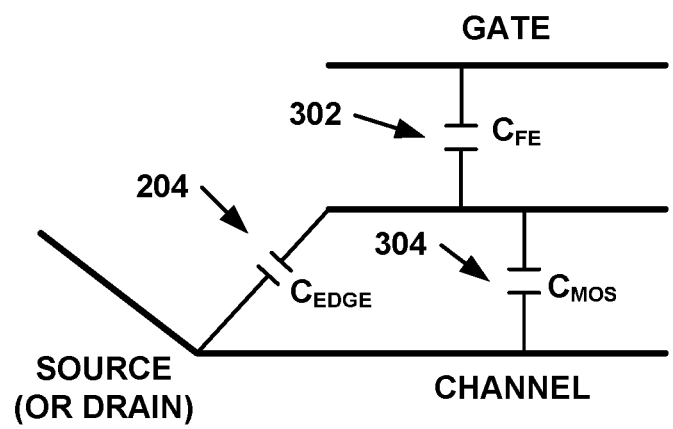
FIG. 3 is a schematic model of at least some of the capacitances within the 3D transistors with ferroelectric film.

FIG. 3 is a schematic model 300 of at least some of the capacitances within the 3D transistors with ferroelectric film. The schematic model 300 can be applied to the structure shown in FIG. 2A and can be better understood if one assumes that an imaginary electrode exists at the interface between the ferroelectric and the dielectric in FIG. 2A and is represented by the middle electrode between the gate and the channel in FIG. 3. FIG. 2A includes a ferroelectric-to-dielectric capacitance ($C_{FE}$) 302, the imaginary internal gate to channel capacitance ($C_{MOS}$) 304 and the gate edge capacitance ($C_{EDGE}$) 204. $C_{MOS}$ is the capacitance due to the gate dielectric from the (imaginary) internal gate to the channel. As discussed above, $C_{EDGE}$ is the capacitance to the source/drain and their extension regions due to the fringing electric field lines. The voltage gain of the 3D transistor can be expressed in EQ. 1.

$$V_G \text{Amplification} = \beta = \frac{\partial V_{MOS}}{\partial V_G} = \frac{|C_{FE}|}{|C_{FE}| - (C_{MOS} + C_{EDGE})} \quad \text{EQ. 1}$$

As can be seen from EQ. 1, the voltage gain is increased by making the internal gate capacitance or the "gate capacitance", ($C_{MOS}+C_{EDGE}$), close to absolute value of $C_{FE}$. Even for the subthreshold region of transistor operation, where the gate to channel capacitance $C_{MOS}$ is small, if $C_{EDGE}$ is close to the magnitude of $C_{FE}$, the gain can be large. Therefore, the 3D transistor can be optimized by selecting a raised source and drain structure where the minimum distance, D is small enough to make $C_{EDGE}$ significantly large to match to the $C_{FE}$ even where $C_{MOS}$ is small. In simulations, if the gate capacitance was deliberately under estimated by not including a gate spacer, mostly Si3N4, and the epitaxial raised source and drain, the voltage gain is less than if these structural elements were included, thus demonstrating the positive effect of higher parasitic capacitance $C_{EDGE}$. Higher gain can therefore be increased by increasing the parasitic capacitances by using an raised drain and source and/or by using a minimum distance (D) 206. An example of a suitable distance, D includes a distance less than 30 nm.

In addition to manipulating the structure, the 3D transistor can be optimized by adjusting $C_{FE}$. One technique for optimizing the 3D transistor includes adjusting $C_{FE}$ by adjusting the ferroelectric film thickness ($T_{FE}$). Simulations reveal that utilizing a thin and weak ferroelectric film (30 µC/µm2 is an order of magnitude lower than the common ferroelectric materials such as PZT) is excellent for the 3D transistor 100. As a result, the candidate material classes can be expanded to include HfxZr1-xOyN1-y, AlxIn1-xN and others. Examples of suitable materials for the ferroelectric film include hafnium zirconium oxide, hafnium oxide, zirconium oxide, Pb(Zr,Ti)O, and BaTiO.

It was also discovered that adjusting the $T_{FE}$ to match capacitance with a dielectric having a thicker effective oxide thickness (EOT) increased the voltage gain and minimized the required Vg without causing hysteresis. For example, it was possible to lower the required Vg to 0.2V with a thicker 1.2 nm EOT in one example. A thicker EOT allows the $C_{FE}$ to be closer to $C_{MOS}$ in the subthreshold region of transistor operation without crossing $C_{MOS}$ in the inversion region of transistor operation, i.e., making the $C_{MOS}$ vs. Vg curve flatter. In addition, a thicker EOT may improve the interface quality and carrier mobility. Examples of suitable EOTs include EOT values greater than 0.8 nm even for gate length of less than 22 nm. In some situations, EOTs greater than 1.2 nm can be used.

The techniques discussed herein also allow for the use of thinner ferroelectric films than used in conventional techniques. As a result of the novel capacitance matching techniques and the constructive use of parasitic capacitances, the larger ferroelectric capacitance resulting from a thinner ferroelectric film can still be matched to achieve exceptional, or at least desirable, performance. The thickness of the ferroelectric film may be less than 10.0 nm which is not tolerable in conventional designs. The thickness may be less than 7.0 nm in some situations. Ferroelectric films of 3.7 nm can be utilized in the exemplary techniques while still meeting the capacitance matching requirements. Thinner ferroelectric films reduce material cost and allow for the production of very small transistors.

Conventional techniques are suitable for a relatively large gate length and ignores the influence of parasitic capacitance $C_{EDGE}$. $C_{EDGE}$ is independent of gate length, $L_G$, while $C_{MOS}$ is proportional to it. Both are proportional to the channel width of the transistor. Since conventional techniques strive to reduce the parasitic capacitances, large gate lengths are utilized in the prior art. The resulting channel capacitance overwhelms the parasitic capacitance when the gate length is large. For the 3D transistor techniques discussed herein, however, the parasitic capacitances are utilized to improve performance. As a result, relatively small gate lengths can be used. As a result, 3D transistors having gate lengths of less than 22 nm can be implemented that still exhibit subthreshold swings less than 59 mV/decade. In some cases, the gate length is less than 20 nm. A gate length of 14 nm can be used.

Figure 4A:
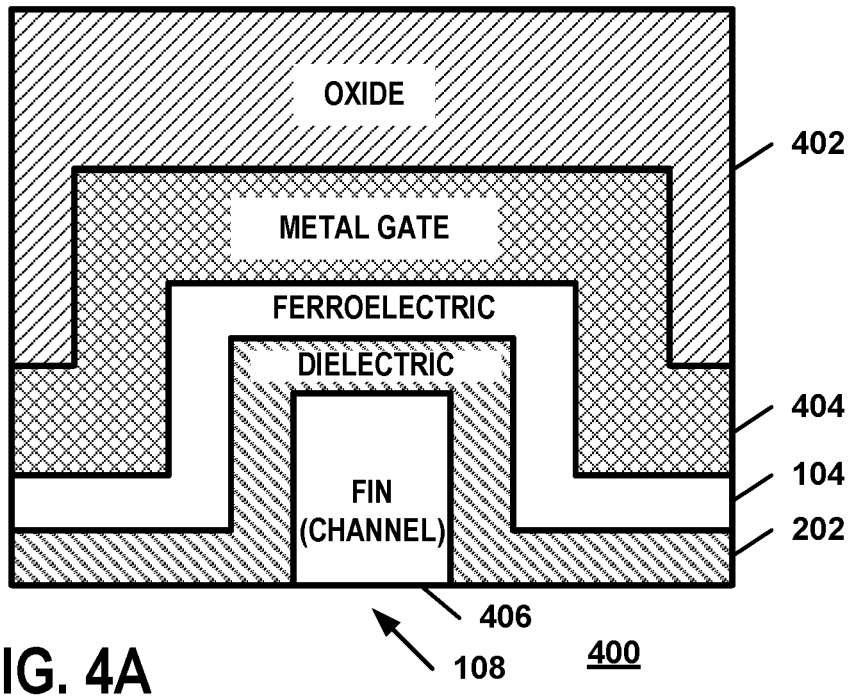
FIG. 4A is an illustration of a cross sectional view of an example of a Negative Capacitance (NC) FinFET with a ferroelectric film.

Therefore, for the examples discussed herein, three-dimensional (3D) transistor structures include an additional ferroelectric film to form a Negative Capacitance (NC). The ferroelectric film may be added to the gate stack of a 3D transistor. As discussed above, the transistor may have any of several structures. FIGS. 4A-K are illustrations of cross sectional views of examples of 3D transistor structures. FIG. 4A is an illustration of a cross sectional view of an example of a NC FinFET 400 with a ferroelectric film 104. An example of a suitable ferroelectric film 104 includes a ZrHfO ferroelectric film. For the example, an oxide 402 is positioned over a metal gate 404. A dielectric 202 is between the ferroelectric film 104 and the Fin channel 406. In some situations, the dielectric is a high-K dielectric such as HfO, HfSiO, HfLaO, or ZrO.

Figure 4B:
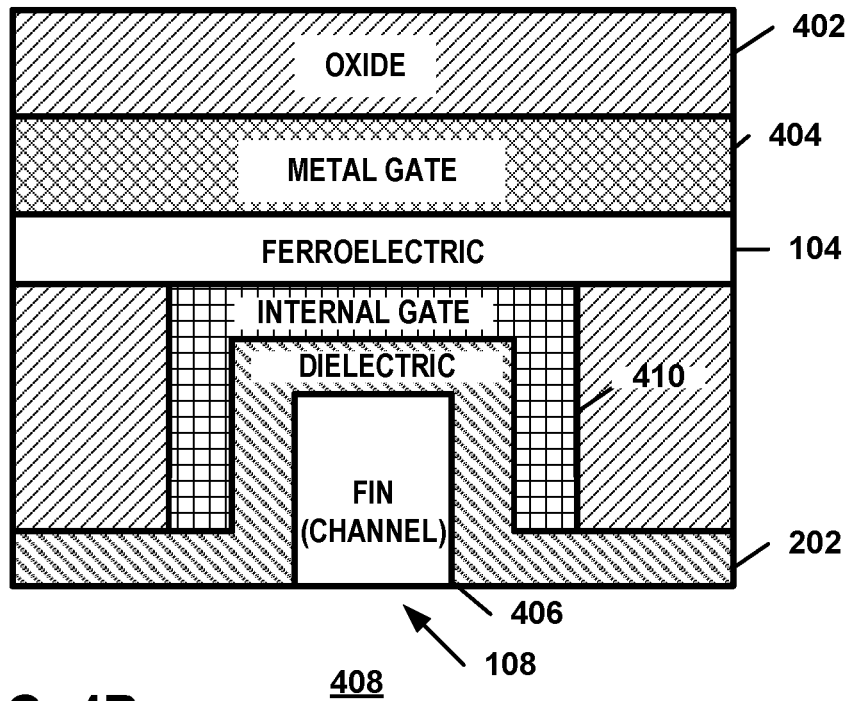
FIG. 4B is an illustration of a cross sectional view of a first example of an internal-gate NC FinFET 408 with a ferroelectric film.
Figure 4C:
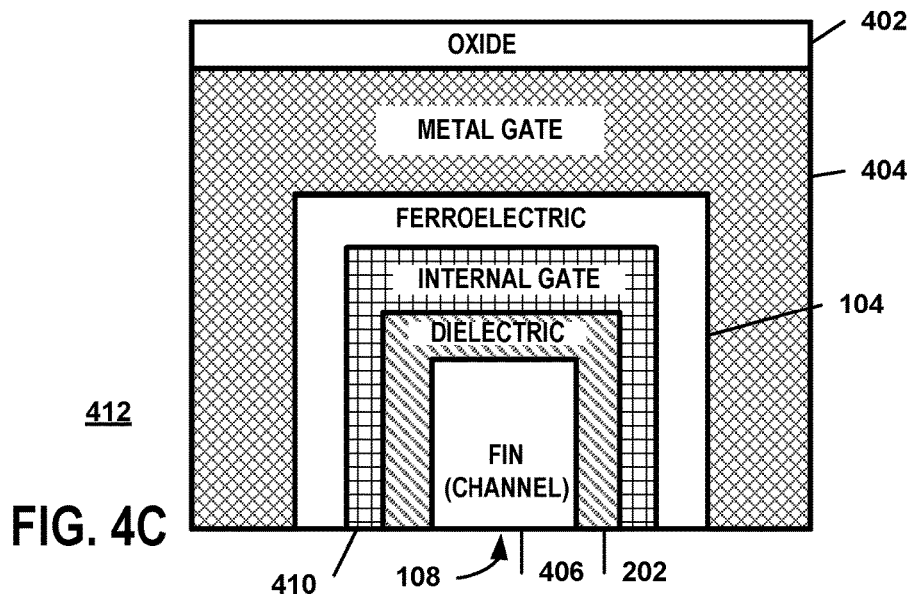
FIG. 4C is an illustration of a cross sectional view of a second example of an internal-gate NC FinFET with a ferroelectric film.

FIG. 4B is an illustration of a cross sectional view of a first example of an internal-gate NC FinFET 408 with a ferroelectric film 104. The structure of internal-gate NC FinFET 408 is similar to the NC FinFET 400 except that an internal gate 410 is positioned between the ferroelectric film 104 and the dielectric 202. FIG. 4C is an illustration of a cross sectional view of a second example of an internal-gate NC FinFET 412 with a ferroelectric film 104.

Embodiments of the present invention are not limited to FinFET implementations but may more generally include other 3D transistor structures. A 3D NC transistor can also employ a variety of different 3D transistor structures as the baseline design, modified to include a ferroelectric film. As examples, other well known 3D transistor structures include Trigate or Tri-Gate (two alternative names of FinFET on bulk substrate), other variants of FinFETs such as the Omega-FET, nanowire FinFET, Gate-All-Around transistors, horizontal and vertical nanowire transistors, and nanotube transistors. These structure names tend to overlap and are not mutually exclusive, but "Gate-All-Around" tends to suggest stacked multiple channels while "nanowire" tends to suggest a somewhat round shaped channel.

Figure 4D:
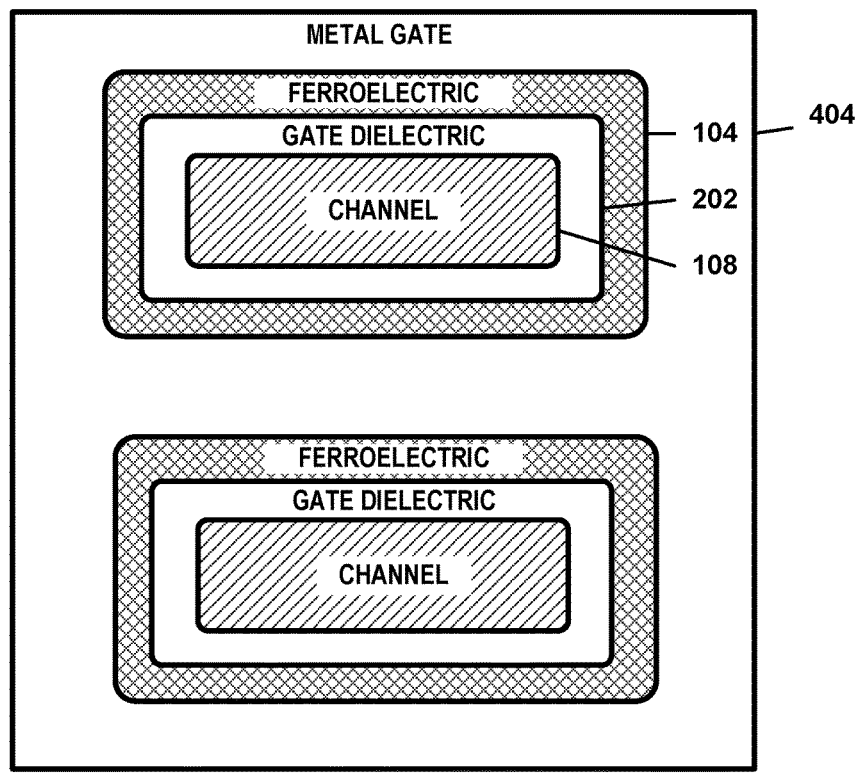
FIG. 4D is an illustration of a cross sectional view of an example of a NC-GAA with a ferroelectric film.
Figure 4E:
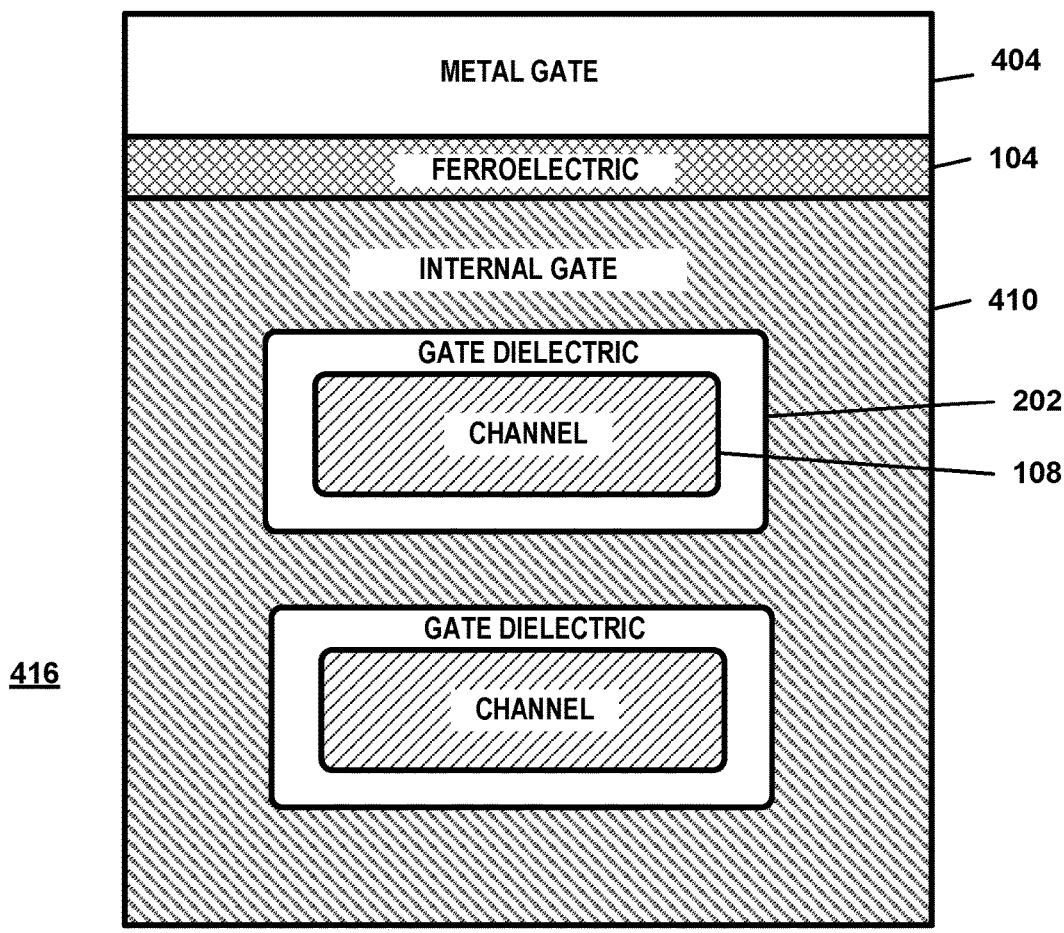
FIG. 4E is an illustration of a cross sectional view of a first example of an internal-gate NC-GAA with a ferroelectric film.
Figure 4F:
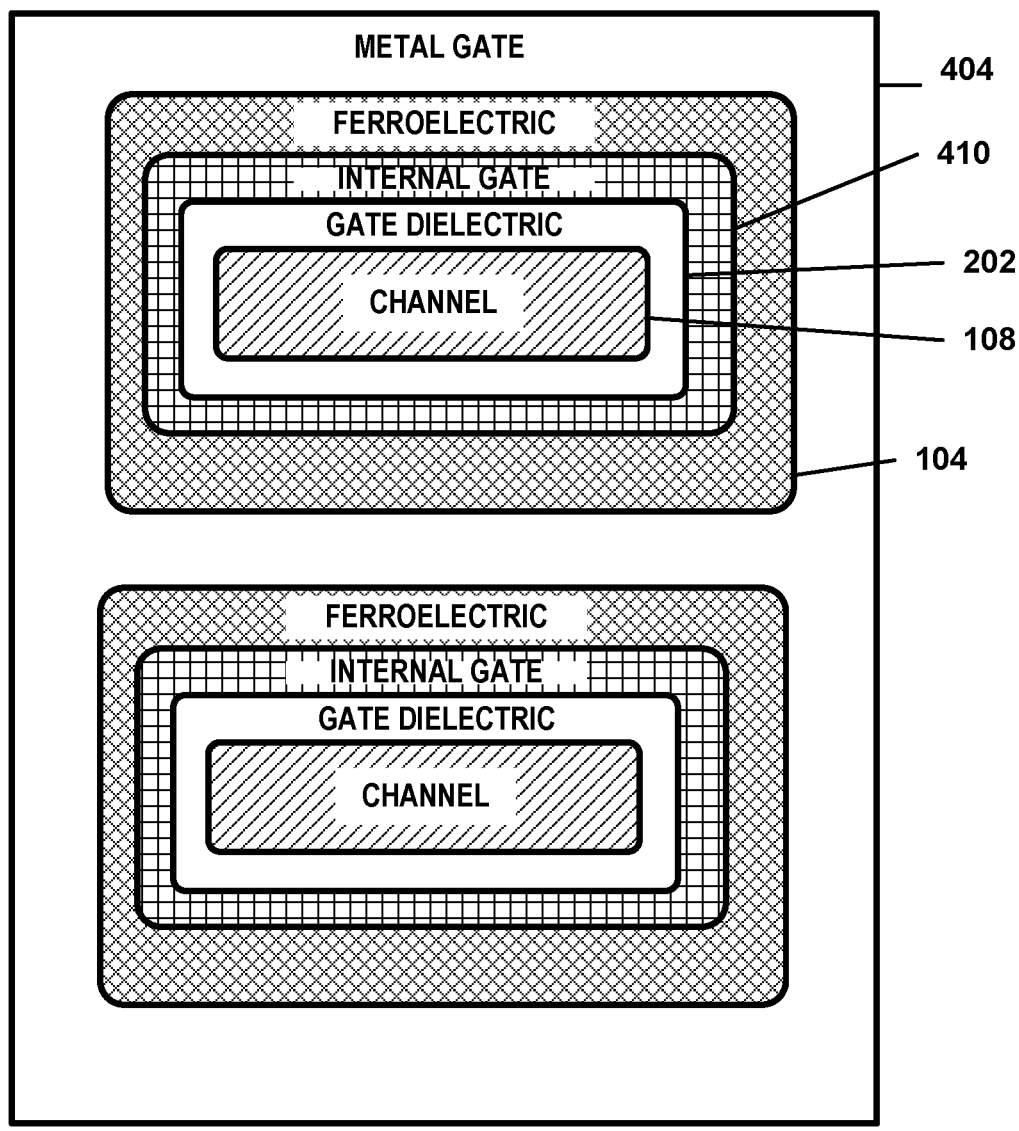
FIG. 4F is an illustration of a cross sectional view of a second example of an internal-gate NC-GAA with a ferroelectric film.
Figure 4G:
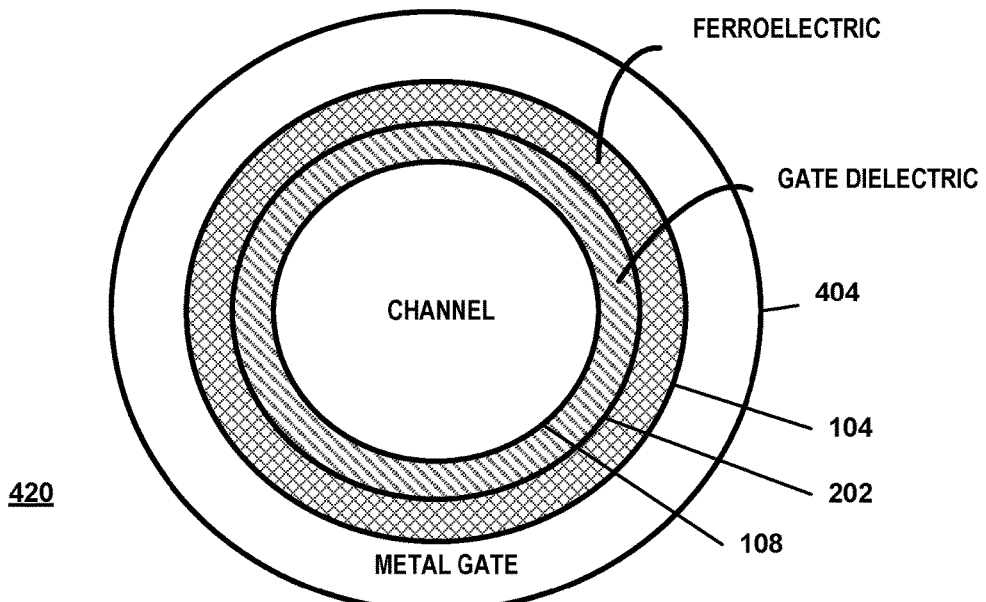
FIG. 4G is an illustration of a cross sectional view of an example of a NC-Nanowire FET with a ferroelectric film.
Figure 4H:
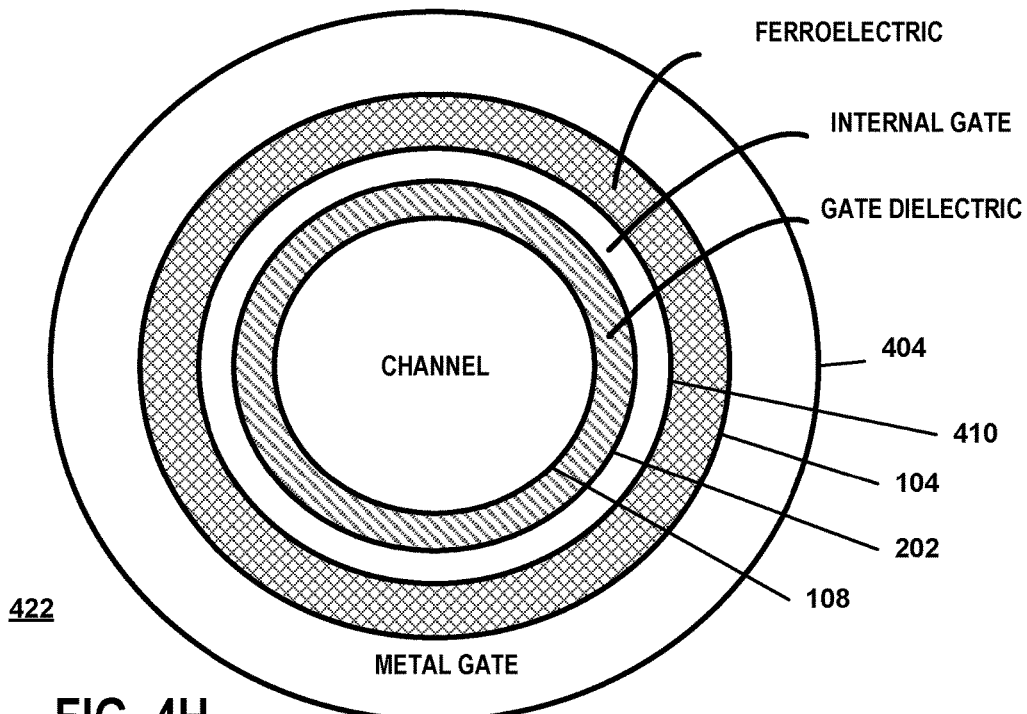
FIG. 4H is an illustration of a cross sectional view of a first example of an internal-gate NC-Nanowire FET with a ferroelectric film.
Figure 4J:
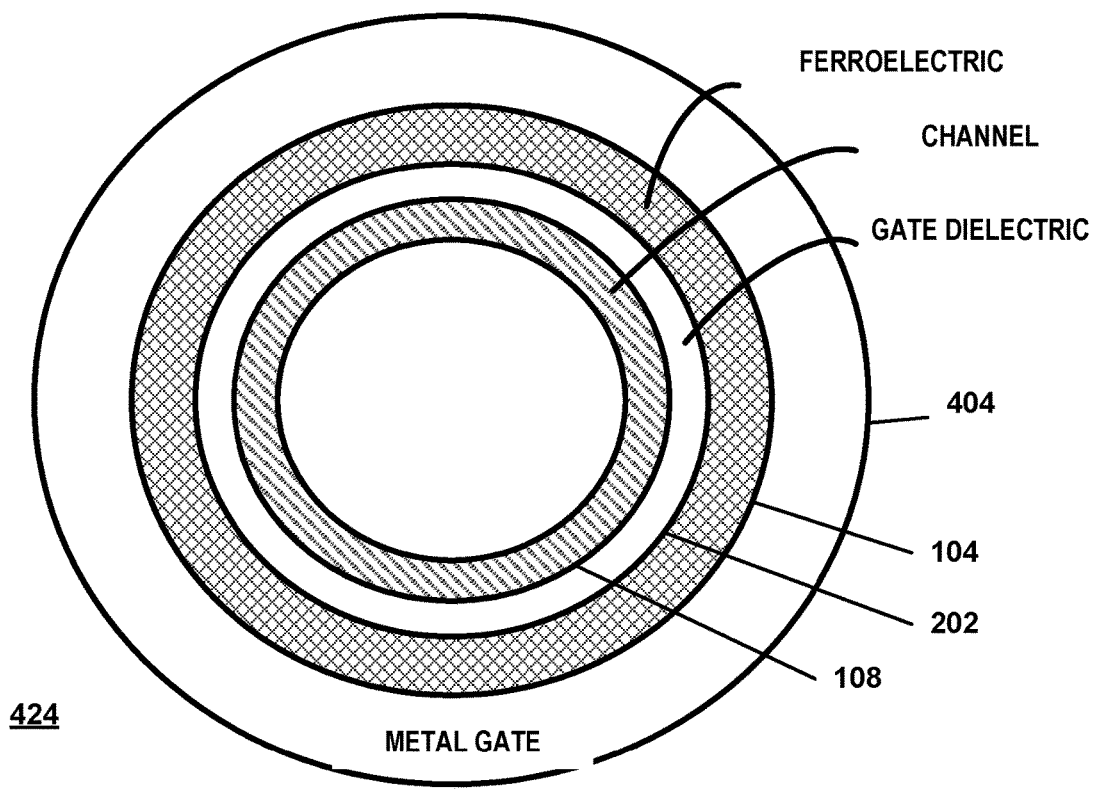
FIG. 4J is an illustration of a cross sectional view of a second example of an internal-gate NC-Nanowire FET with a ferroelectric film.
Figure 4K:
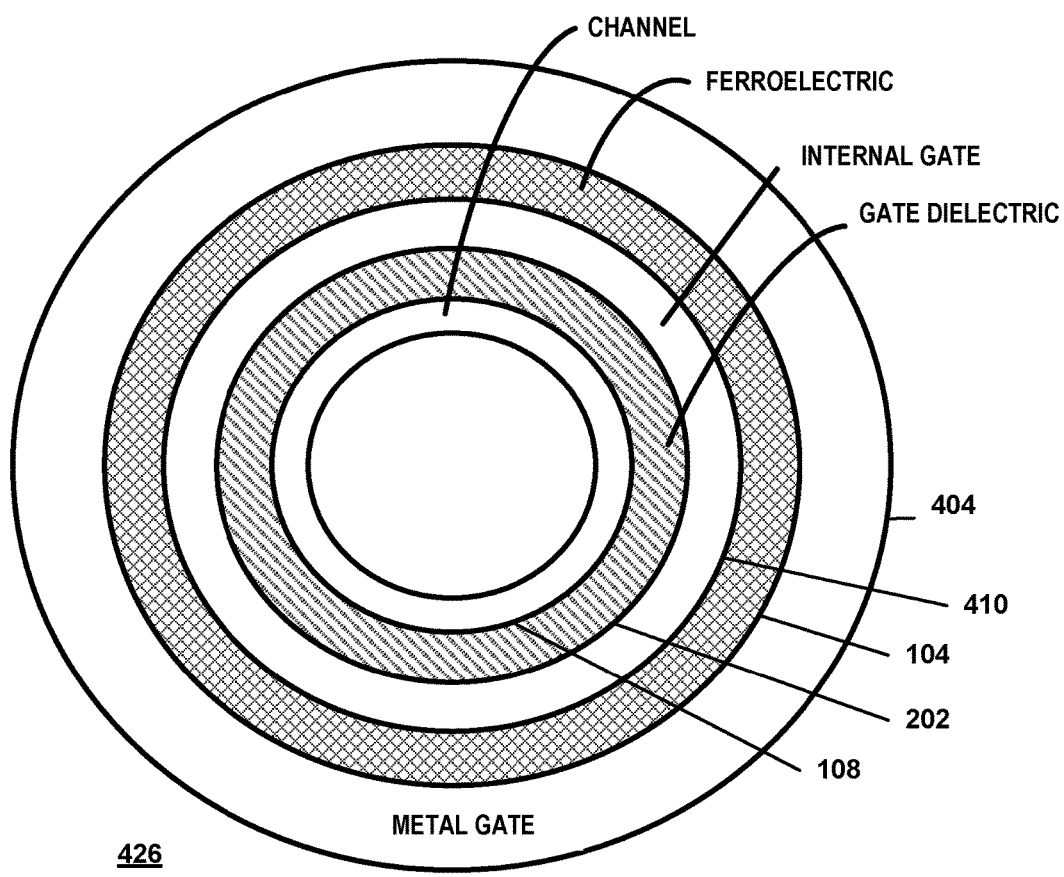
FIG. 4K is an illustration of a cross sectional view of an example of an internal-gate NC-Nanotube FET with a ferroelectric film.

FIG. 4D is an illustration of a cross sectional view of an example of a NC-GAA 414 with a ferroelectric film 104. FIG. 4E is an illustration of a cross sectional view of a first example of an internal-gate NC-GAA 416 with a ferroelectric film 104. FIG. 4F is an illustration of a cross sectional view of a second example of an internal-gate NC-GAA 418 with a ferroelectric film 104. FIG. 4G is an illustration of a cross sectional view of an example of a NC-Nanowire FET 420 with a ferroelectric film 104. FIG. 4H is an illustration of a cross sectional view of a first example of an internal-gate NC-Nanowire FET 422 with a ferroelectric film 104. FIG. 4J is an illustration of a cross sectional view of a second example of an internal-gate NC-Nanowire FET 424 with a ferroelectric film 104IG. 4K is an illustration of a cross sectional view of an example of an internal-gate NC-Nanotube FET 426 with a ferroelectric film 104.

Techniques to fabricate 3D transistors without ferroelectric films are well known. Methods to deposit ferroelectric films are well known that are compatible with other integrated circuit fabrication processes. Consequently, conventional techniques to fabricate 3D transistors may be modified to deposit an additional ferroelectric film in order to form a 3D NC transistor.

The advantages of 3D transistors in power, speed, leakage, and density as well as the methods of fabricating these 3D transistors are known. The method of fabricating a 3D Negative Capacitance Transistor is closely parallel to the known method of fabricating similar 3D transistor without a ferroelectric film, such as FinFET on SOI substrate, but incorporating additional deposition of the new ferroelectric film or the internal gate conductor and ferroelectric film as discussed above. The methods of depositing the preferred HfZrO and other ferroelectric thin films such as Pb(Zr,Ti)O and BaTiO are well known. The methods of depositing a conductor such a TiN, TaN, or Ru, for the additional internal gate, are also well known. The methods of integrating the ferroelectric film in a 2D Negative Transistor gate stack are also known.

Figure 5:
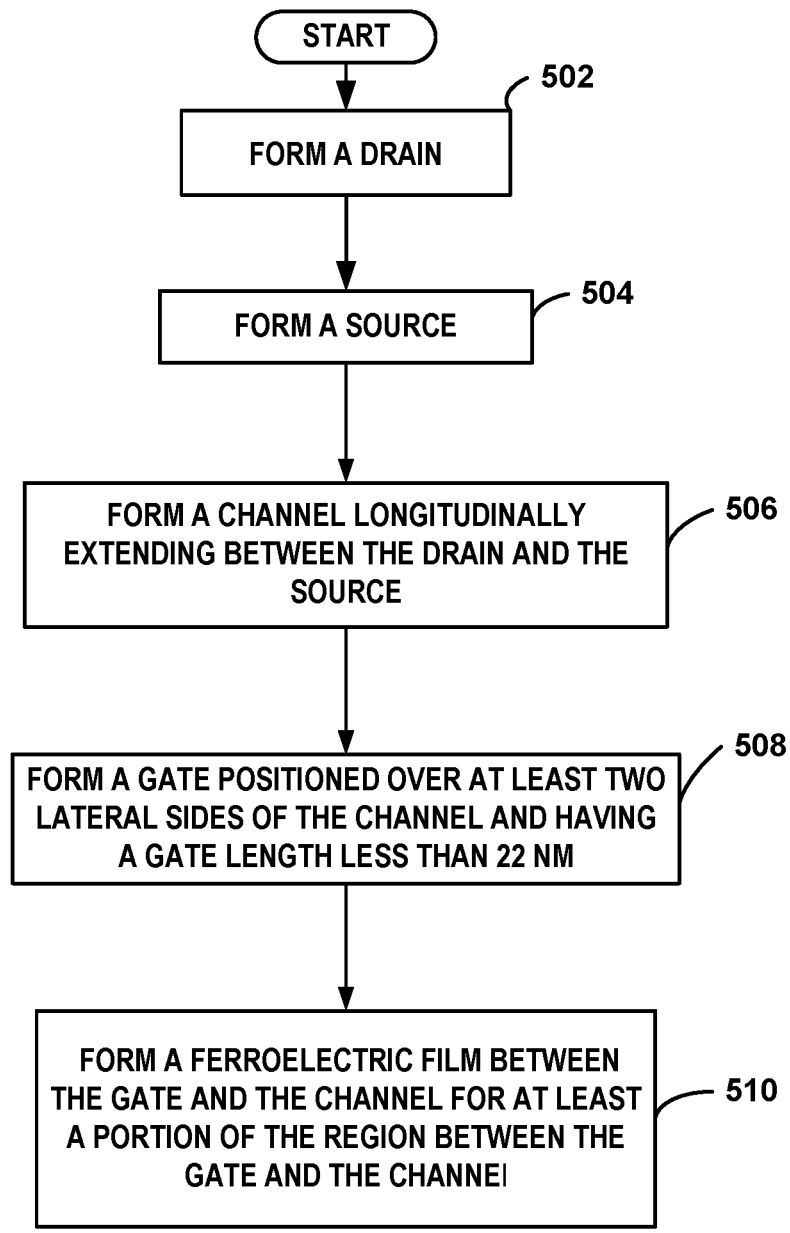
FIG. 5 is a flow chart of a method of fabricating a three-dimensional transistor having a ferroelectric film.

FIG. 5 is a flow chart of a method of fabricating a three-dimensional transistor having a ferroelectric film. The selected steps discussed with reference to FIG. 5 may occur in any order. Some steps may occur simultaneously. For example, steps 502 and 504 may be performed at the same time. For the example, the three-dimensional transistor is configured and fabricated to operate with less than 59 mV per decade subthreshold swing at room temperature. The various steps are performed in accordance with known techniques and the teachings above.

At step 502, a drain is formed.

At step 504, a source is formed.

At step 506, a channel is formed to longitudinally extend between the drain and the source.

At step 508, a gate is formed such that it is positioned over at least two lateral sides of the channel. For the example, the gate is formed to have a gate length less than 22 nm.

At step 510, a ferroelectric film is formed between the gate and the channel for at least a portion of the region between the gate and the channel.

While examples of individual 3D NC transistors have been provided, it will be understood that circuits including more than one 3D NC transistor may be fabricated on an integrated circuit. Many 3D NC transistors may be fabricated simultaneously in a monolithic integrated circuit. For example, an integrated circuit implementation may include a large number (e.g., hundreds of thousands or millions) of 3D NC transistors. As described below in more detail, the 3D NC transistors may be used for a portion of the transistors in an integrated circuit or for all of the transistors, depending on implementation details and the characteristics of individual portions of an integrated circuit.

As discussed above, a 3D Negative Capacitance Transistor can be designed to operate with less than 59 mV/decade subthreshold swing with a 22 nm gate length and below. In contrast, prior art 3D transistors cannot operate with a subthreshold swing less than 59 mV/decade at room temperature. Additionally, the 3D Negative Capacitance transistor has various advantages over 2D Negative Capacitance transistors. Conventional 2D Negative Capacitance Transistors cannot operate at 22 nm gate length or below with performance competitive for commercial use.

The 3D Negative Capacitance Transistor can be designed to have capacitance matching of the ferroelectric capacitance and the Metal Oxide Semiconductor (MOS) gate capacitance of the transistor. It is highly desirable to have better capacitance matching, over the entire operating range of gate voltage (Vg), between the ferroelectric capacitance and the MOS gate capacitance, which is known to have strong Vg dependence, especially for 3D transistors, which have undoped or lightly doped channels. As discussed above, the larger $C_{EDGE}$ parasitic capacitances, which are independent of Vg, can be utilized in a 3D transistor more effectively than in 2D transistors to create a better match between the gate capacitance and the ferroelectric capacitance $C_{FE}$ over the entire operating range of Vg. The parasitic capacitance leads to lower operation voltage, Vg that is required to generate the desired on-state drain current, Id, which determines the speed of the circuits. Lower operating voltage leads to lower power consumption. The larger gate to source/drain parasitic capacitance of 3D transistors has been known to be a detriment to their speed and power but is tolerated for the better scalability of 3D transistors. It is not obvious and highly counter-intuitive that the combination of a 3D transistor and the ferroelectric film should make a better Negative Capacitance Transistor with lower power consumption than if it had the smaller parasitic gate capacitance of a 2D transistor.

The 3D Negative Capacitance transistors can be designed to use very thin ferroelectric films for low cost and high density. Future advanced device fabrication will require very thin gate stacks for low cost and high density.

The 3D Negative Capacitance Transistor techniques described herein allow the use of thinner ferroelectric films than 2D Negative Capacitance Transistors. The structure shown in FIG. 4B and FIG. 4E create ferroelectric capacitors having smaller areas than the MOS-channel capacitor areas. The smaller ferroelectric capacitor areas permit the use of a thinner ferroelectric film to match the ferroelectric capacitance and the MOS gate capacitance and this match is required for achieving low power performance. This is another novel and not obvious reason to combine the 3D transistors and Negative Capacitance.

The 3D Negative Capacitance Transistor is compatible with relatively simple fabrication processes and dense device fabrication. For example, the 3D Negative Capacitance Transistor example without an internal gate shown in FIG. 4A simplifies the fabrication process, and the thinner gate stack is more compatible and attractive for future dense device fabrication.

The 3D Negative Capacitance Transistor is compatible with a variety of baseline 3D transistor structures and fabrication processes, including FinFET and FinFET variations, Gate All Around, and nanowire structures. Alternative 3D transistor embodiments include FinFET on bulk substrate, Trigate or Tri-Gate (two alternative names of FinFET on bulk substrate), Omega-FET, nanowire FinFET, Gate-All-Around transistor, horizontal and vertical nanowire transistors, and nanotube transistors.

Each of the examples can employ many different materials as the material of the transistor channel (the Fin in FinFET for example). While the preferred channel material is Si today, alternative channel materials that are well taught in the public literature include SiGe, Ge, III-V semiconductors such as InGaAs, 2D materials (having no relationship to 2D transistor structure) such as grapheen and MoS2 [20] and other transition-metal-dichalgenides. The preferred channel material of the nanotube transistor is Carbon Nanotube with its attractively high electron and hole mobilities.

The preferred gate dielectric over the channel (e.g., the Fin channel in a FinFET) is HfO (hafnium oxide) but more generally the gate dielectric may be one of a large number of gate high-k dielectrics such as HfSiO, HfLaO, ZrO, etc. The "effective oxide thickness" (EOT) has continually and monotonically decreased over the past decades from 100 nm to the 0.8 nm that is used for the state of the art 14 nm FinFET node because thinner EOT is known to reduce the 2D and 3D transistors' operation voltage and power consumption. There is no teaching that EOT of commercial 3D transistors beyond the 14 nm node would use gate dielectric with an EOT at or larger than 0.8 nm because too large an operating voltage would be required to achieve the necessary Id and speed, or using SiON gate dielectric because SiON would create too large a gate leakage current at such small EOT for commercial use. On the contrary, all teachings including the industry official "Roadmap", the International Technology Roadmap of Semiconductors, teach continued use of high-k dielectric and reduction of EOT beyond 0.8 nm. Through the techniques discussed herein and simulations, however, a 14 nm 3D Negative Capacitance Transistor will perform with lower operating voltage and therefore lower power consumption if EOT is raised from 0.8 nm to 1.2 nm. Simulations further demonstrate that EOT reduction to 0.5 nm would raise the operating voltage and therefore power consumption, contrary to all prior teachings for 3D transistors. Embodiments of the present invention include 3D Negative Capacitance Transistors beyond the 14 nm node having SiON gate dielectric or having gate dielectric EOT less than 0.8 nm. The techniques discussed herein improve the electron and hole surface mobilities, device reliability, and the capacitance matching of the Negative Capacitance Transistor for better power and speed performance.

Because the compositions of the gate dielectric and the ferroelectric film may be similar, both containing a combination of Hf, Zr, and O, for example, it would reduce yield killing particles and ambient contamination by depositing the gate dielectric and the ferroelectric film in the same deposition tool without breaking the vacuum.

The 3D Negative Capacitance Transistor can use HfZrO (hafnium zirconium oxide) as the ferroelectric film or any other ferroelectric material such as Pb(Zr,Ti)O, BaTiO, and similar materials.

The Id versus Vg characteristics of a 3D Negative Capacitance Transistor are qualitatively different from the Id versus Vg characteristics of a regular (baseline) 3D transistor. Specifically, the transconductance Gm, i.e., dId/dVg may not rise as fast in the lower portion of the Vg operating range and may not saturate as much in the higher portion of the Vg operating range as the baseline FinFET. The qualitative differences in the Id-Vg and Gm-Vg characteristics are acceptable for digital applications where the transistors function as on-off switches. On the other hand, they make the reuse of existing analog circuit libraries and design techniques and design automation tools difficult and increase the time and cost of circuit design.

The techniques and examples discussed herein can be applied to integrated circuit (IC) structures that contain the 3D Negative Capacitance Transistors and the baseline 3D transistors monolithically integrated in the same chip. The 3D Negative Capacitance Transistors can be used for circuits that can accept the new and different 3D Negative Capacitance Transistor characteristics such as the digital circuits. The digital circuits employ nearly all the transistors in a typical IC and all the transistors in some. Therefore, the low power benefit of the 3D Negative Capacitance Transistor is essentially intact. The remaining circuits such as some analog circuits that cannot accept the new and different characteristics of the 3D Negative Capacitance Transistor can continue to use the baseline 3D transistors and the related circuit libraries, design techniques, and design automation tools. Fabricating this integrated structure requires the avoidance of depositing the additional ferroelectric film on the baseline transistors by protecting them with a protective coating during the deposition step.

Clearly, other embodiments and modifications of this invention will occur readily to those of ordinary skill in the art in view of these teachings. The above description is illustrative and not restrictive. This invention is to be limited only by the following claims, which include all such embodiments and modifications when viewed in conjunction with the above specification and accompanying drawings. The scope of the invention should, therefore, be determined not with reference to the above description, but instead should be determined with reference to the appended claims along with their full scope of equivalents.

What is claimed is:

1. A 3D transistor comprising:
a drain;
a source;
a channel longitudinally extending between the drain and the source;
a gate positioned over at least two lateral sides of the channel and having a gate length less than 22 nm; and
a ferroelectric film between the gate and the channel for at least a portion of the region between the gate and the channel, the 3D transistor having a structure configured to operate with less than 59 mV per decade subthreshold swing at room temperature, the ferroelectric film having a ferroelectric capacitance substantially matched, over an operating range of a gate voltage, to a sum of a gate to channel capacitance ($C_{MOS}$) and a gate edge capacitance ($C_{EDGE}$), the $C_{EDGE}$ resulting between at the edge portion of the gate and between the gate and the source and the source extension, and the gate and the drain and the drain extension.

2. The 3D transistor of claim 1, wherein the 3D transistor has a structure selected from the group comprising FinFET, nanowire FET, Gate-All-Around FET, nanowire FinFET, Omega FET, and nanotube FET structures and combinations thereof.

3. The 3D transistor of claim 1, wherein a ferroelectric capacitance of the ferroelectric film is substantially matched to a gate to channel capacitance ($C_{MOS}$) over an operating range of a gate voltage.

4. The 3D transistor of claim 1, wherein the ferroelectric film has a thickness less than 10.0 nm.

5. The 3D transistor of claim 4, wherein the ferroelectric film has a thickness less than 7.0 nm.

6. The 3D transistor of claim 1, wherein the ferroelectric film comprises a film selected from the group comprising: hafnium zirconium oxide, hafnium oxide, zirconium oxide, Pb(Zr,Ti)O, and BaTiO.

7. The 3D transistor of claim 1, further comprising an internal conductive gate positioned between the channel and the ferroelectric film.

8. The 3D transistor of claim 7, wherein a material of the internal gate is selected from the group comprising TiN, TaN, Ru, W, and Si.

9. The 3D transistor of claim 7, wherein the gate is in close proximity to only a portion of the internal gate and configured to reduce the effective area of the gate to internal gate ferroelectric capacitor area.

10. The 3D transistor of claim 1, further comprising a dielectric film between the channel and the ferroelectric film.

11. The 3D transistor of claim 10, wherein the dielectric film is selected from the group consisting of SiO2 and SiON and wherein the gate is a metal gate.

12. The 3D transistor of claim 10, further comprising a gate dielectric with an effective oxide thickness (EOT) more than 0.8 nm.

13. The 3D transistor of claim 1, wherein the structure is configured to have a current-voltage characteristic similar to a MOSFET without a ferroelectric film, the current-voltage characteristic not having significant hysteresis.

14. A method of fabricating a three-dimensional transistor configured to operate with less than 59 mV per decade subthreshold swing at room temperature, the method comprising:
forming a drain;
forming a source;
forming a channel longitudinally extending between the drain and the source;
forming a gate positioned over at least two lateral sides of the channel and having a gate length less than 22 nm; and
forming a ferroelectric film between the gate and the channel for at least a portion of the region between the gate and the channel; and
substantially matching, over an operating range of a gate voltage, a ferroelectric capacitance of the ferroelectric film to a sum of a gate to channel capacitance ($C_{MOS}$) and a gate edge capacitance ($C_{EDGE}$), the $C_{EDGE}$ resulting at the edge of the gate and between the gate and the source and its extension, and the gate and the drain and its extension.

15. The method of claim 14, wherein the forming the ferroelectric film comprises forming the ferroelectric film to have an effective oxide thickness (EOT) greater than 0.8 nm.

16. The method of claim 14, further comprising forming a gate dielectric between the channel and the ferroelectric film, wherein the gate dielectric and the ferroelectric film are formed in the same deposition tool without breaking vacuum.

17. A 3D transistor comprising:
a drain;
a source;
a channel longitudinally extending between the drain and the source;
a gate positioned over at least two lateral sides of the channel and having a gate length less than 22 nm; and
a ferroelectric film between the gate and the channel for at least a portion of the region between the gate and the channel, the 3D transistor having a structure configured to operate with less than 59 mV per decade subthreshold swing at room temperature, the ferroelectric film having a ferroelectric capacitance substantially matched to a gate to channel capacitance ($C_{MOS}$) over an operating range of a gate voltage.

18. The 3D transistor of claim 17, wherein the 3D transistor has a structure selected from the group comprising FinFET, nanowire FET, Gate-All-Around FET, nanowire FinFET, Omega FET, and nanotube FET structures and combinations thereof.

19. The 3D transistor of claim 17, wherein a ferroelectric capacitance of the ferroelectric film is substantially matched, over an operating range of a gate voltage, to a sum of a gate to channel capacitance ($C_{MOS}$) and a gate edge capacitance ($C_{EDGE}$), the $C_{EDGE}$ resulting between at the edge portion of the gate and between the gate and the source and the source extension, and the gate and the drain and the drain extension.

20. The 3D transistor of claim 17, wherein the ferroelectric film has a thickness less than 10.0 nm.

21. The 3D transistor of claim 20, wherein the ferroelectric film has a thickness less than 7.0 nm.

22. The 3D transistor of claim 17, wherein the ferroelectric film comprises a film selected from the group comprising: hafnium zirconium oxide, hafnium oxide, zirconium oxide, Pb(Zr,Ti)O, and BaTiO.

23. The 3D transistor of claim 17, further comprising an internal conductive gate positioned between the channel and the ferroelectric film.

24. The 3D transistor of claim 17, further comprising a dielectric film between the channel and the ferroelectric film.

25. The 3D transistor of claim 24, wherein the dielectric film is selected from the group consisting of SiO2 and SiON and wherein the gate is a metal gate.

26. The 3D transistor of claim 24, further comprising a gate dielectric with an effective oxide thickness (EOT) more than 0.8 nm.

27. A 3D transistor comprising:
a drain;
a source;
a channel longitudinally extending between the drain and the source;
a gate positioned over at least two lateral sides of the channel and having a gate length less than 22 nm;
a ferroelectric film between the gate and the channel for at least a portion of the region between the gate and the channel;
an internal conductive gate positioned between the channel and the ferroelectric film, the gate in close proximity to only a portion of the internal gate and configured to reduce the effective area of the gate to internal gate ferroelectric capacitor area, the 3D transistor having a structure configured to operate with less than 59 mV per decade subthreshold swing at room temperature.

28. The 3D transistor of claim 27, wherein the 3D transistor has a structure selected from the group comprising FinFET, nanowire FET, Gate-All-Around FET, nanowire FinFET, Omega FET, and nanotube FET structures and combinations thereof.

29. The 3D transistor of claim 27, wherein a material of the internal gate is selected from the group comprising TiN, TaN, Ru, W, and Si.

* * * * *